(12) United States Patent
Krivokapic

(10) Patent No.: US 6,537,920 B1
(45) Date of Patent: Mar. 25, 2003

(54) FORMATION OF VERTICAL TRANSISTORS USING BLOCK COPOLYMER LITHOGRAPHY

(75) Inventor: Zoran Krivokapic, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/809,900

(22) Filed: Mar. 16, 2001

(51) Int. Cl.[7] .............................................. H01L 21/302
(52) U.S. Cl. ...................... 438/717; 438/705; 438/156; 438/207; 438/481
(58) Field of Search ................................ 438/705, 706, 438/714, 717, 718, 724, 725, 737, 738, 743, 744, 156, 206, 207, 212, 268, 481

(56) References Cited

U.S. PATENT DOCUMENTS

| | | | | |
|---|---|---|---|---|
| 4,673,962 A | * | 6/1987 | Chatterjee et al. | 357/23.6 |
| 4,816,884 A | * | 3/1989 | Hwang et al. | 357/23.6 |
| 4,824,793 A | * | 4/1989 | Richardson et al. | 437/47 |
| 4,845,539 A | * | 7/1989 | Inoue | 357/23.6 |
| 5,157,091 A | * | 10/1992 | Masataka et al. | 526/245 |
| 5,612,563 A | * | 3/1997 | Fitch et al. | 257/329 |
| 5,627,427 A | * | 5/1997 | Das et al. | 313/308 |
| 5,641,694 A | * | 6/1997 | Kenney | 438/156 |
| 5,698,870 A | * | 12/1997 | Nakano et al. | 257/194 |
| 5,976,920 A | * | 11/1999 | Nakano et al. | 438/172 |
| 6,037,202 A | * | 3/2000 | Witek | 438/212 |
| 6,087,270 A | * | 7/2000 | Reinberg et al. | 438/736 |
| 6,358,849 B1 | * | 3/2002 | Havemann et al. | 438/689 |

OTHER PUBLICATIONS

Park et al., Block Copolymer Lithography: Periodic Arrays of $10^{11}$ Holes in 1 Square Centimeter, May 30, 1997 Science, vol. 276, pp. 1307 and 1401–1404.

* cited by examiner

Primary Examiner—Matthew Smith
Assistant Examiner—Renzo N. Rocchegiani
(74) Attorney, Agent, or Firm—Foley & Lardner

(57) ABSTRACT

A method of forming a vertical transistor in an integrated circuit using copolymer lithography includes providing a dielectric layer over a semi-conductor substrate and depositing a layer of copolymer over the dielectric layer. The copolymer has a first polymer type and a second polymer type. The method further includes removing a portion of the first polymer type from the copolymer layer to form a void in the copolymer layer and removing a portion of the dielectric layer underlying the void to form an aperture in the dielectric layer. The method further includes providing a semiconductor material in the aperture.

20 Claims, 3 Drawing Sheets

FORMATION OF VERTICAL TRANSISTORS USING BLOCK COPOLYMER LITHOGRAPHY

CROSS-REFERENCE TO RELATED APPLICATIONS

Not Applicable.

STATEMENT REGARDING FEDERALLY SPONSORED RESEARCH OR DEVELOPMENT

Not Applicable.

FIELD OF THE INVENTION

The present specification relates generally to the field of integrated circuits and to methods of manufacturing integrated circuits. More particularly, the present specification relates to a method of reducing transistor size and spacing by producing transistors in integrated circuits using block copolymer lithography.

BACKGROUND OF THE INVENTION

This invention relates generally to manufacturing processes for fabricating semiconductor integrated devices. More particularly, it relates to an improved method of forming transistors in integrated circuits that are smaller than what is achievable by conventional lithographic technology.

As is generally known in the semiconductor industries, there is a continuing trend of manufacturing integrated circuits with higher and higher device densities on a smaller chip area. This desire for large scale integration has led to a continued shrinking of the circuit dimensions and features of the devices so as to reduce manufacturing costs and to improve circuit functionality. Reducing the size and spacing of integrated circuit devices is a function of the method used to fabricate those devices.

Producing integrated circuit devices requires the use of lithography, in which patterns of device features are transferred to a resist layer on a semiconductor substrate and portions of the resist layer is selectively removed according to the pattern to produce apertures in the resist layer. Using known etching techniques, the material underlying the resist layer may be selectively etched to produce apertures in the underlying material, since only the areas underlying the apertures will be etched, while the area under the remaining resist layer will be unaffected by the etchant. Following this selective etching, material may be introduced into the apertures in the underlying material to create devices on the integrated circuit.

Several lithographic methods may be used to pattern devices in integrated circuits. Photolithography involves the deposition of a light-sensitive polymer resist onto a material surface. The polymer resist layer is then selectively exposed to light through a mask and developed to create a pattern of holes in the resist. The material underlying the patterned holes may then be etched away to create devices. Despite success using this method, there are negative aspects as well. For example, it is costly and time-consuming to produce light masks which allow selective patterning of the polymer resist. Further, diffraction of the exposing light around the edges of the mask places a limit on the resolution of photolithography such that devices below a certain size and spacing may not reliably be produced.

Periodic patterning using electron beam lithography has also been used in the integrated circuit industry. No masks are required, as the pattern is transferred by using a finely focused beam of electrons to "draw" a pattern on the wafer surface. Patterning of devices is limited, however, in that production of devices having feature sizes below 30 nm is difficult to achieve with commercial electron beam systems. Further, minimum spacing between adjacent devices using electron beam technology is at best 50 nm, and generally not much below 100 nm. Finally, each device must be created individually, such that patterning of many millions of devices on a single integrated circuit is time consuming and results in lower throughput than with photolithography. Ion beam and x-ray lithography techniques suffer from the same defects as electron beam lithography.

The shortcomings of current lithographic methods result in the formation of transistors which are not fully depleted, as full depletion of transistors requires device dimensions smaller than 50 nm.

Block copolymers consist of at least two chemically different homopolymer chain types (also referred to as "segments" or "blocks") connected by covalent bonds. In bulk, similar homopolymer chains spontaneously align to form nanometer-sized domains of like composition that exhibit ordered morphologies. For example, one can create a copolymer film having spheres of polybutadiene in a polystyrene matrix. Increasing or decreasing the number of polymer units in the respective homopolymer chains will alter the homopolymer chain length and molecular weight, and will result in varied bulk morphologies. Periodic arrangements of various shapes, including lamellae, cylinders, or spheres, may be created in this manner.

The chemical difference between the homopolymer chains may be exploited to aid in processing integrated circuit features with very small dimensions. Selectively removing one type of polymer chain from the polymer matrix (e.g. removing the polybudatiene spheres from the polystyrene matrix in the above example) results in a patterned array of voids in the bulk copolymer that could be used as a patterned resist layer, much the same as with other lithographic techniques. One advantage of using masks of patterned copolymer is that the size of devices may be reduced and periodicity of device features may be increased.

Accordingly, there is a need to reduce integrated circuit device dimensions below 50 nm. Further, there is a need to produce integrated circuits having increased device packing density. Even further, there is a need to concurrently produce many devices having increased packing density and reduced device dimensions to increase fabrication throughput.

SUMMARY OF THE INVENTION

According to one exemplary embodiment, a method of forming a vertical transistor in an integrated circuit using block copolymer lithography includes providing a dielectric layer over a semiconductor. The method further includes depositing a layer of copolymer over the dielectric layer. The copolymer has a first polymer type and a second polymer type. The method further includes removing portions of the first polymer type from the copolymer layer to form a void in the copolymer layer and removing a portion of the dielectric layer underlying the void to form an aperture in the dielectric layer. The method further includes providing a semiconductor material in the aperture.

According to another exemplary embodiment, a method of producing an integrated circuit includes forming an oxide layer on a semiconductor substrate and forming a nitride layer over the oxide layer. The method further includes depositing a layer of diblock copolymer over the nitride layer. The diblock copolymer has a first polymer type and a second polymer type. The method further includes removing a portion of the first polymer type from the copolymer layer to form hollow regions in the diblock copolymer layer and removing a portion of the nitride layer underlying the hollow regions to form apertures in the nitride layer. The method further includes removing a portion of the oxide layer underlying the apertures in the nitride layer to form apertures in the oxide layer and forming pillars of semiconductor material in the apertures.

According to another exemplary embodiment, an integrated circuit having at least one million transistors is fabricated by providing an oxide layer on a silicon substrate and providing a nitride layer over the oxide layer. The process further includes providing a copolymer layer over the nitride layer. The copolymer layer has a first polymer type and a second polymer type. The first polymer type segregates to form regions of the first polymer type in a matrix of the second polymer type. The first copolymer type has carbon-carbon double bonds in the polymer backbone. The process further includes exposing the copolymer layer to ozone to create fragments of the first polymer type and removing the fragments of the first polymer type to create voids in the matrix of second polymer type and removing portions of the silicon nitride layer underlying the voids to form apertures in the nitride layer. The process further includes removing a portion of the oxide layer underlying the apertures in the nitride layer to form apertures in the oxide layer and growing epitaxial silicon in the apertures to form silicon pillars.

BRIEF DESCRIPTION OF THE DRAWINGS

Preferred exemplary embodiments are described below with reference to the accompanying drawings, wherein like reference numerals denote like elements, and.

DETAILED DESCRIPTION OF EXEMPLARY EMBODIMENTS

Figure 1:
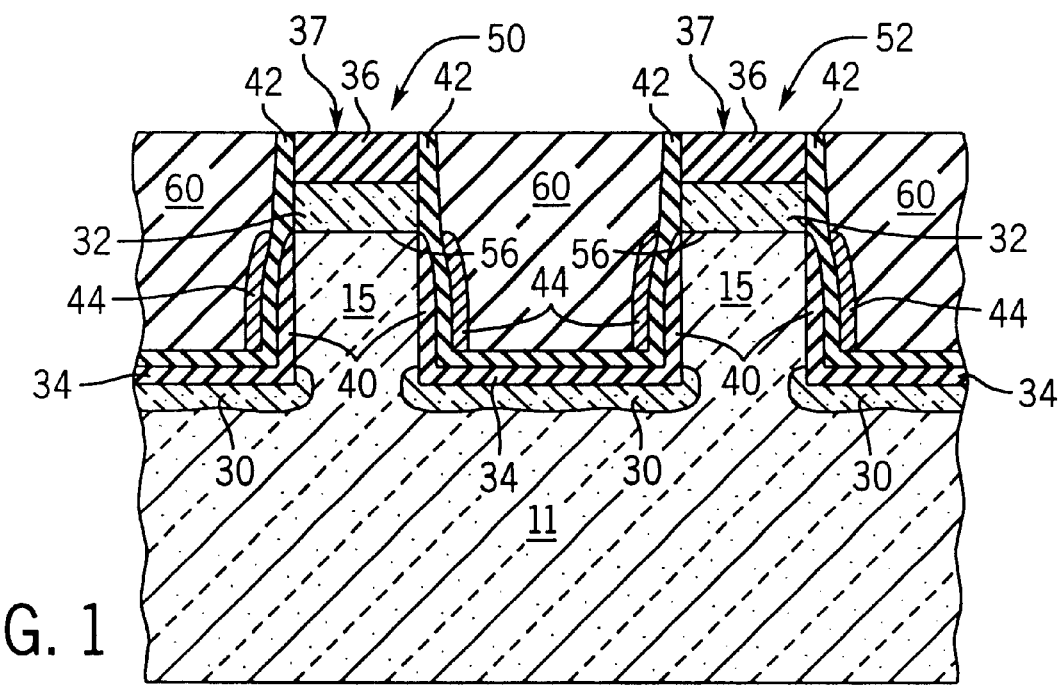
FIG. 1 is a schematic cross-sectional view of a portion of an integrated circuit in accordance with an exemplary embodiment.

Referring to FIG. 1, a cross-sectional view of a portion 10 of an integrated circuit is illustrated in accordance with an exemplary embodiment. Portion 10 may be part of a very large-scale integrated (VLSI) circuit having at least one million transistors. Portion 10 includes transistors 50 and 52, each transistor having a semiconductor pillar 15, doped regions 30 and 32, a surface oxide layer 34, sidewall oxide layers 40, a dielectric layer 42, transistor oxide layer 36, and gate conductors 44. Transistors 50 and 52 are vertical transistors in this exemplary embodiment, wherein transistors 50 and 52 conduct electrons from doped regions 30 to doped regions 32, or vice-versa, in response to a voltage applied at gate conductor 44. Alternatively, other structures may also be included and other types of transistors are contemplated.

Transistors 50 and 52 are provided on a semiconductor substrate 11. Substrate 11 may be silicon or any semiconductive material, such as gallium arsenide. Substrate 11 may also be lightly doped either p-type or n-type.

In the embodiment shown in FIG. 1, surface oxide layer 34 is a layer of insulating material that separates doped regions 30 from dielectric layer 42. Surface oxide layer 34 can be a single layer or a composite layer. Preferably, oxide layer 34 includes an insulative material, such as a gate insulator, $SiO_2$, etc. Sidewall oxide layers 40 separate semiconductor pillars 15 from dielectric layer 42, and may include $SiO_2$ or another insulative material, such as, silicon nitride, $ZrO_2$, $HfO_2$, etc. Pillars 15 are epitaxially grown on substrate 11, and are made from the same material as is substrate 11.

Dielectric layer 42 includes any of a variety of dielectric materials and isolates semiconductor pillars 15 from gate conductor 44. Preferably, dielectric layer 42 is a nitride layer, such as $Si_3N_4$. Alternatively, dielectric layer 42 can be SiON. Gate conductor 44 may include conductive materials, such as, polysilicon, doped polysilicon, aluminum, titanium, amorphous silicon, SiGe, titanium nitride, tantalum, tungstin, nickel, copper and silver. Doped regions 30 and 32 may be doped with either n-type or p-type materials using any known dopant implantation or diffusion method. In an exemplary embodiment, regions 30 and 32 are implanted with phosphorous ions.

In the exemplary embodiment shown in FIG. 1, semiconductor pillars 15 have a height of 20 to 40 nm measured from a top surface 54 of substrate 11 to top surfaces 56 of pillars 15, and a width of 20 to 50 nm. Doped regions 30 are 10 to 20 nm thick in substrate 11. Doped regions 32 have a thickness of 10 to 20 nm. Sidewall oxide layers 40 have a width of 1.0–1.2 nm, and surface oxide layers 34 have a thickness of 2.0 to 4.0 nm. Dielectric layer 42 has a thickness of 1.0 to 1.5 nm. These dimensions are merely exemplary and may be greater or smaller in different embodiments.

Figure 2:
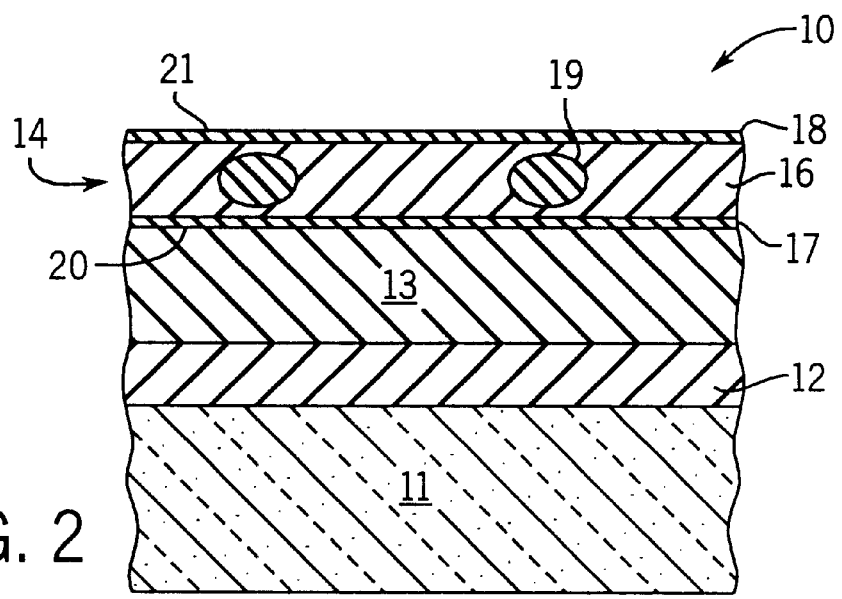
FIG. 2 is a schematic cross-sectional view of the portion of the integrated circuit of FIG. 1, illustrating a diblock copolymer deposition step.

A method of forming portion 10 is described below with reference to FIGS. 2–7. The method advantageously forms portion 10 including pillars of vertical transistors having very small dimensions. In FIG. 2, a cross-sectional view of portion 10 illustrates a diblock copolymer deposition step. First, an oxide layer 12 is thermally grown on substrate 11. In an exemplary embodiment, oxide layer 12 is $SiO_2$ and has a thickness of 3 to 4 nm. Dielectric layer 13 is then formed over oxide layer 12. Dielectric layer 13 may be any dielectric material and may be formed by any suitable deposition process, such as chemical vapor deposition (CVD), physical vapor deposition (PVD), etc. In an exemplary embodiment, dielectric layer 13 is a $Si_3N_4$ nitride layer having a thickness of 25 to 160 nm. Alternatively, dielectric layer 13 may be SiON.

A layer of copolymer 14 is then deposited on dielectric layer 13 by spin coating. Copolymer 14 may be a block copolymer, such as a diblock copolymer. Copolymer layer 14 is made up of a first polymer type and a second polymer type. In an exemplary embodiment, copolymer layer 14 is a polystyrene-polybutadiene copolymer and has a thickness of approximately 50 nm, wherein the first polymer type includes polystyrene and the second polymer type includes polybutadiene. In alternative embodiments, the copolymer layer may consist of other copolymer materials, such as polystyrene-polyisoprene.

In the exemplary embodiment illustrated in FIG. 2, the copolymer layer will include spheres of a first polymer type 19 in a matrix of a chemically-different second polymer type 16. Additionally, wetting layers 17 and 18 of the first polymer type will form at the nitride-copolymer interface 20 and at the copolymer-surface interface 21. In an exemplary embodiment, diblock copolymer 14 consists of polystyrene (PS) and polybutadiene (PB) homopolymer chains. The resulting morphology will consist of PB spheres in a PS matrix, with PB wetting layers forming at the nitride-copolymer interface and at the copolymer-surface interface. In an alternative embodiment, the molecular weight ratio of PS to PB chains may be altered to effect different morphologies. In an alternative embodiment, copolymer layer 14 may consist of PB cylinders in a PS matrix.

Figure 3:
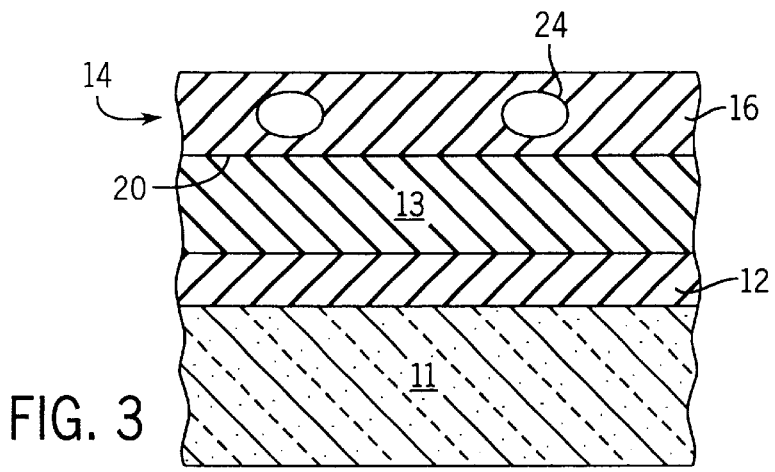
FIG. 3 is a schematic cross-sectional view of the portion of the integrated circuit of FIG. 1, illustrating a copolymer ozonization step.

FIG. 3 is a cross-sectional view of portion 10 illustrating a copolymer ozonization step. With reference to FIG. 2, the first polymer type used to form spheres 19 and wetting layers 17 and 18 includes carbon-carbon double bonds in the polymer backbone. When the copolymer layer 14 is exposed to ozone, the ozone acts to sever the carbon-carbon double bonds in spheres 19 and wetting layers 17 and 18, leaving polymer fragments. In contrast, matrix 16 is unaffected by ozonization, since the second polymer type used to form matrix 16 does not include carbon-carbon double bonds in its polymer backbone. The fragments of the first polymer type may then be removed from the matrix by water or other means to produce voids or hollow regions 24 in place of the spheres 19. In this manner, ozonization produces an array of holes in layer 14. Additionally, the ozonization and removal of wetting layers 17 and 18 reduces the thickness of layer 14 to less than 50 nm. In an exemplary embodiment having a PS-PB copolymer layer consisting of PB wetting layers and PB spheres in a PS matrix, ozonization results in elimination of the PB wetting layers and the formation of spherical voids in place of PB spheres. The ozone attacks the carbon-carbon double bonds in the PB, but does not affect the PS matrix since PS includes no carbon-carbon double bonds in the polymer backbone.

Figure 4:
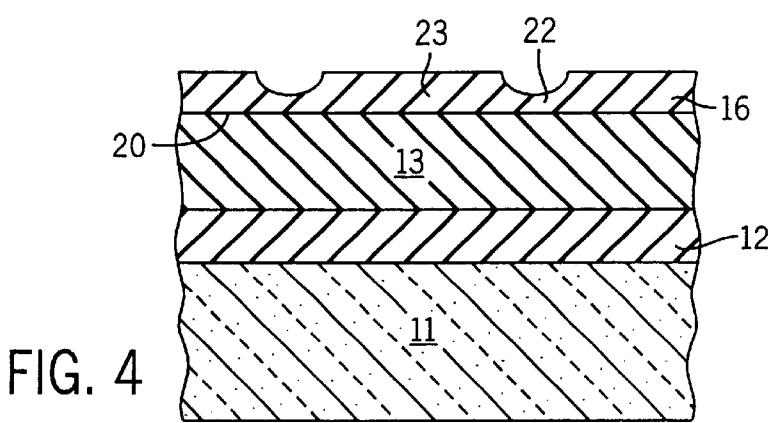
FIG. 4 is a schematic cross-sectional view of the portion of the integrated circuit of FIG. 1, illustrating a reactive ion etching step.

Formation of voids 24 in layer 14 allows for selective etching of dielectric layer 13. Prior to ozonization, layer 14 has a substantially uniform material thickness. Ozonization and removal of fragments from layer 14 results in an effective thickness variation across the layer 14, since material was removed to form voids 24. Whereas the first and second polymer types used to form spheres 19 and matrix 16 may exhibit similar etching resistance, a pattern of decreased effective thickness across the matrix 16 allows for selective etching of the areas beneath voids 24. FIG. 4 is a cross-sectional view of portion 10 illustrating a reactive ion etching (RIE) step in which a portion of the matrix has been removed. In an exemplary embodiment, a fluorine-based RIE is used, such as, $CF_4$ or $CF_4/O_2$. Matrix region 22, corresponding to a portion of the matrix beneath a void, is thinner than matrix region 23, corresponding to a portion of the matrix not containing a void. As the matrix 16 is etched further, complete removal of matrix region 22 will occur prior to the complete removal of matrix region 23, thus leaving some of matrix region 23 unetched. As a result, dielectric layer 13 will be selectively exposed in regions underlying voids 24, and the unetched matrix region 23 will act as a mask layer for the nitride layer beneath it. As etching proceeds beyond this point, the nitride layer may be etched in the pattern formed by voids 24. In an exemplary embodiment, etching will form holes that penetrate the entire depth of dielectric layer 13 and have diameters between 30 and 70 nm. In this manner, oxide layer 12 will be exposed when the holes in dielectric layer 13 reach the surface of the oxide layer.

Figure 5:
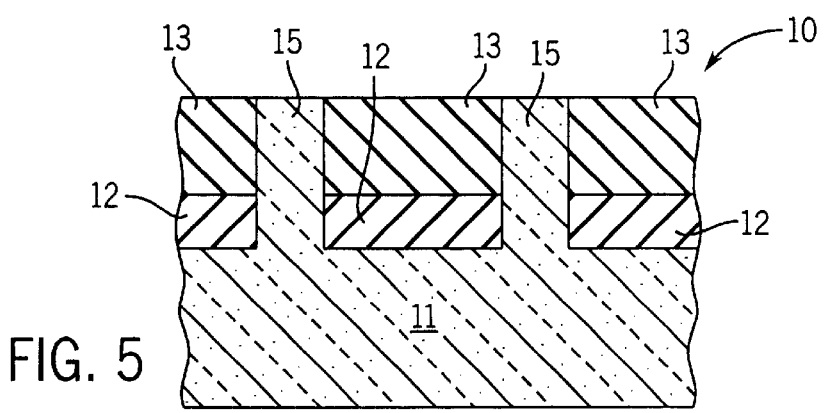
FIG. 5 is a schematic cross-sectional view of the portion of the integrated circuit of FIG. 1, illustrating a semiconductor pillar formation step.

FIG. 5 is a cross-sectional view of portion 10 illustrating a semiconductor pillar formation step. Portions of oxide layer 12 exposed by the nitride etching is etched away using either wet or dry etching methods, such that the holes extend entirely through dielectric layer 13 and oxide layer 12 to reveal portions of substrate 11. Any remaining material from layer 14 is removed. Pillars of semiconductor material 15 are then formed in the holes and adjacent to substrate 11. In an exemplary embodiment in which substrate 11 is silicon, pillars 15 are formed by epitaxially growing silicon at 750°–900° C. in the holes to form pillars of silicon. Epitaxial growth of silicon allows pillars 15 and substrate 11 to share a uniform and continuous crystal structure, which ensures good carrier mobility in the pillar. Any silicon extending beyond the surface of the dielectric layer 13 is removed by polishing, such that the surface of the dielectric layer and the top of the pillars are substantially coplanar. Alternatively, amorphous silicon or other semiconductive material may be deposited in the holes to substantially fill the holes. A subsequent annealing step will harden the amorphous silicon to form pillars 15. Other methods of forming pillars 15 are contemplated.

Figure 6:
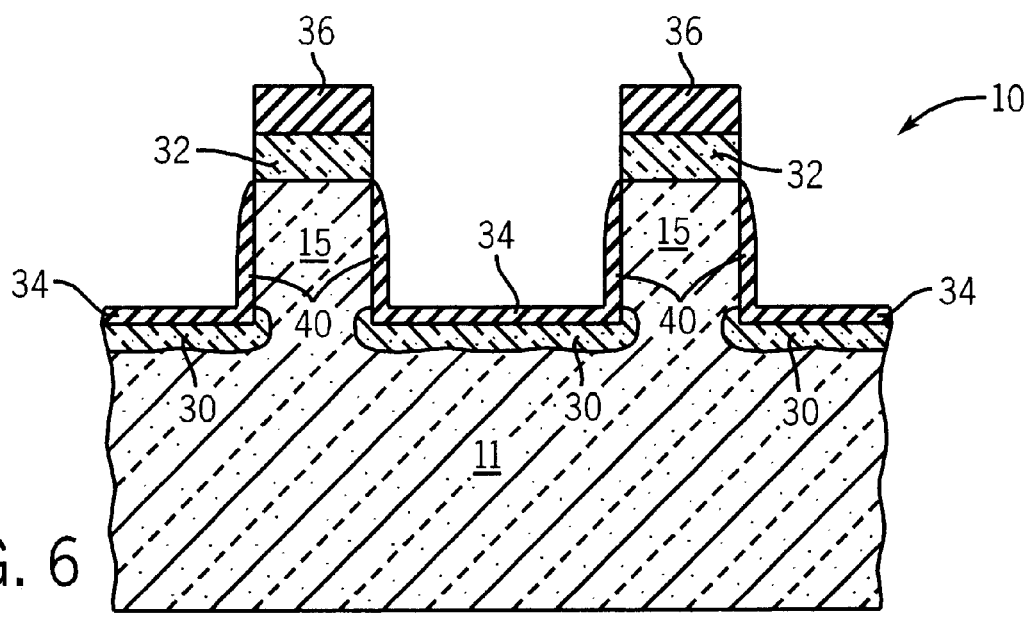
FIG. 6 is a schematic cross-sectional view of the portion of the integrated circuit of FIG. 1, illustrating a dopant implantation and oxide layer formation step.

FIG. 6 is a cross-sectional view of portion 10 illustrating a dopant implantation and oxide layer formation steps. A mask is applied that covers pillars 15 and the remaining dielectric layer 13 is removed by wet etching using a solution of hot phosphoric acid. Oxide layer 12 is removed by either wet or dry etching, leaving substrate 11 exposed. A portion of the substrate underlying the etched regions will be doped to create trench isolation structures (not shown), which will allow for electrical insulation between adjacent transistors. Dopant material is introduced into the substrate 11 and pillars 15 using any acceptable means of ion implantation or diffusion to form doped source and drain regions 30 and doped pillar regions 32. The dopants may be either n-type or p-type. In an exemplary embodiment, phosphorous ions are implanted using a dose of approximately $1.0 \times 10^{15}$ to $3.0 \times 10^{15}$ cm$^{-2}$ at 5–10 keV to create n-type doped source and drain regions 30 and n-type doped pillar regions 32. Following the dopant implantation, the dopants are activated by subjecting the doped regions to a rapid thermal anneal for between five and ten seconds at between 1000° C. and 1025° C. In an exemplary embodiment of the present invention, the rapid thermal anneal proceeds for 5 seconds at 1000° C.

After dopant activation is completed, an oxide is formed on the doped source and drain regions 30 and pillars 15 to form surface oxide layer 34 and sidewall oxide layers 40. In an exemplary embodiment in which substrate 11 and pillars 15 are silicon, oxide layers 34 and 40 are produced by oxidizing the silicon in an $O_2$ atmosphere for between one and five minutes at approximately 800° C. Thicker oxide is formed on the n-type source and drain regions 30, 32 than on undoped silicon regions such as the sides of silicon pillars 15. As a result, surface oxide layer 34 formed over source and drain regions 30 is thicker than that formed on sidewall oxide layers 40 formed on silicon pillars 15, such that the surface oxide layer 34 has thickness between 2 and 4 nm and sidewall oxide layers 40 have thickness between 1.0 and 1.2 nm. Additionally, transistor oxide layers 36 are formed on doped regions 32, and has a thickness between 2 and 4 nm.

Figure 7:
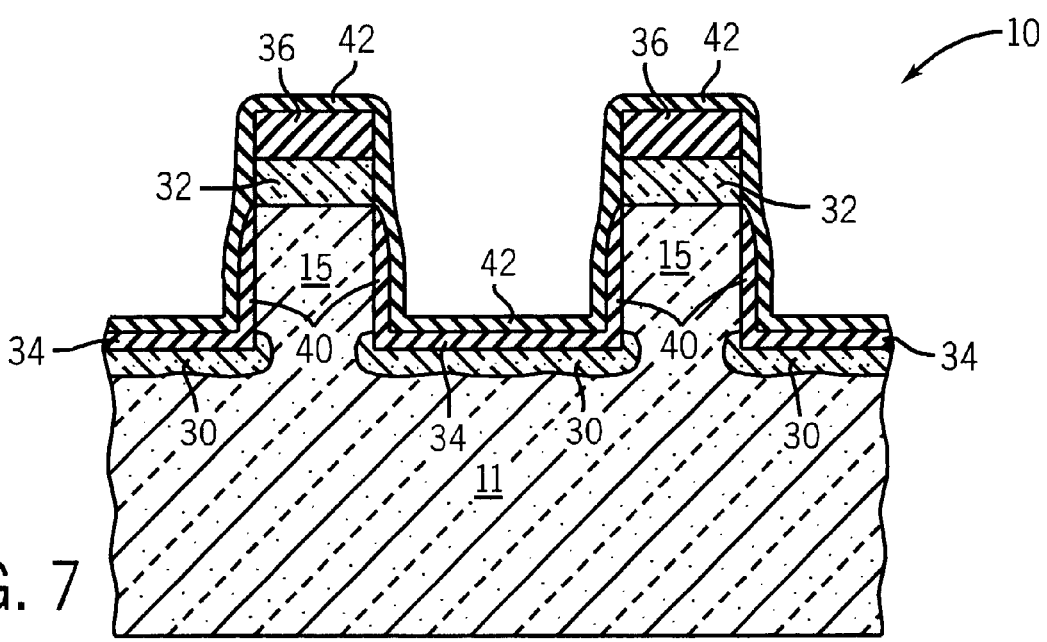
FIG. 7 is a schematic cross-sectional view of the portion of the integrated circuit of FIG. 1, illustrating a dielectric layer formation step.

FIG. 7 is a cross-sectional view of portion 10 and illustrates a dielectric layer formation step. Dielectric material is deposited over surface oxide layer 34, sidewall oxide layers 40, and doped pillar regions 32 using a remote plasma nitride system to form nitride layer 42. In an exemplary embodiment, dielectric layer 42 is silicon nitride. Preferably, dielectric layer 42 has a thickness of approximately 1.0 nm. The height of the nitride layer 42 defines the channel length of the pillars 15, and the circumference of the nitride layer 42 defines the channel width. In an exemplary embodiment, the channel length of the pillars is 20 nm, and the channel width is 200 nm.

Referring to FIG. 1, a conductive material is deposited between pillars 15. In an exemplary embodiment, the deposited metal has a thickness of approximately 10 nm and is aluminum, platinum, nickel, or another gate conductor material. The conductive material is then anisotropically etched to form gate conductors 44 using conventional masking techniques to protect a portion of the conductive material overlying oxide layer 34. In forming gate conductors 44, etching removes the conductive material around doped regions 32. After etching, the gate conductors 44 have a thickness of approximately 5 nm. The width of the gate conductors minimizes parasitic capacitance of the gate above doped region 30.

After formation of gate conductors 44, silicon dioxide is deposited over the gate conductors 44 by decomposition of tetraethylorthosilicate (TEOS) to form TEOS region 60. Region 60 is then polished back to the surface of the transistor oxide layer 37 such that the surface of the TEOS region 60 and the top surface of the transistor oxide layer 37 are substantially coplanar. The polishing step eliminates the portion of dielectric layer 42 overlying transistor oxide layer 36, such that surface 37 is exposed. In an alternative embodiment, silicon dioxide formed from TEOS deposition is polished to a level approximately 2000 Å above the surface of the transistor oxide layer 37. In this alternative embodiment, a contact mask is applied and the a portion of the deposited silicon dioxide and dielectric layer 42 are etched away to allow formation of a contact with the transistors.

Thus, the method described with reference to FIGS. 1–7 allows one to fabricate transistors having very small dimensions in integrated circuits to ensure that they are fully depleted and to allow for more efficient device operation. Further, the method allows for the production of integrated circuits having increased packing density, while increasing device production throughput.

While the embodiments illustrated in the FIGURES and described above are presently preferred, it should be understood that these embodiments are offered by way of example only. Other embodiments may include, for example, different techniques for removing the first polymer type from the copolymer layer 14 or different polymer ratios in the copolymer layer which may result in varied morphologies for producing different patterns in the underlying dielectric layer. The invention is not limited to a particular embodiment, but extends to various modifications, combination, and permutations that nevertheless fall within the scope of the appended claims.

What is claimed is:

1. A method of forming a vertical transistor in an integrated circuit using copolymer lithography, the method comprising:

providing a dielectric layer over a semiconductor substrate;

depositing a layer of copolymer over the dielectric layer, the copolymer having a first polymer type and a second polymer type;

removing a portion of the first polymer type from the copolymer layer to form a void in the copolymer layer;

removing a portion of the dielectric layer underlying the void to form an aperture in the dielectric layer; and providing semiconductor material in the aperture.

2. The method of claim 1, further comprising:

forming an oxide layer on the semiconductor substrate; and removing a portion of the oxide layer underlying the aperture in the dielectric layer to form a second aperture in the oxide layer.

3. The method of claim 1, wherein the second polymer type is polystyrene.

4. The method of claim 3, wherein the first polymer type is polybutadiene.

5. The method of claim 1, wherein the step of removing a portion of the first polymer type includes exposing the copolymer layer to ozone.

6. The method of claim 1, wherein the void has a generally spherical shape.

7. The method of claim 6, wherein the void has a diameter of between 30 and 70 nm.

8. The method of claim 1, wherein the dielectric layer includes silicon nitride.

9. The method of claim 1, wherein the substrate includes silicon and the step of providing a semiconductor material includes growing epitaxial silicon in the aperture for form a pillar.

10. The method of claim 1, wherein the step of removing a portion of the dielectric layer includes using a $CF_4$ reactive ion etch.

11. A method for producing an integrated circuit, the method comprising:

forming an oxide layer on a semiconductor substrate;

forming a nitride layer over the oxide layer;

depositing a layer of diblock copolymer over the nitride layer, the diblock copolymer having a first polymer type and a second polymer type, removing a portion of the first polymer type from the diblock copolymer layer to form hollow regions in the diblock copolymer layer;

removing a portion of the nitride layer underlying the hollow regions to form apertures in the nitride layer;

removing a portion of the oxide layer underlying the apertures in the nitride layer to form apertures in the oxide layer; and forming pillars of semiconductor material in the apertures.

12. The method of claim 11, wherein the first polymer type is polybutadiene and the second polymer type is polystyrene.

13. The method of claim 11, wherein the removing a portion of the first polymer type from the diblock copolymer layer step includes exposing the diblock copolymer layer to ozone.

14. The method of claim 11, wherein the hollow regions are generally spherical in shape and have diameters between 30 and 70 nm.

15. The method of claim 11, wherein the semiconductor substrate is silicon and the forming pillars of semiconductor material step includes growing epitaxial silicon in the apertures.

16. The method of claim 11, wherein the removing a portion of the nitride layer step comprises using a $CF_4$ reactive ion etch.

17. A method for producing an integrated circuit having at least one million transistors, the method comprising:

forming an oxide layer on a silicon substrate;

forming a nitride layer over the oxide layer;

forming a copolymer layer over the nitride layer, the copolymer layer having a first polymer type and a second polymer type, the first polymer type segregating to form regions of first polymer type in a matrix of second polymer type, the first polymer type having carbon-carbon double bonds in the polymer backbone;

a exposing the copolymer layer to ozone to create fragments of first polymer type;

removing the fragments of the first polymer type to create voids in the matrix of the second polymer type;

removing portions of the silicon nitride layer underlying the voids to form apertures in the nitride layer;

removing a portion of the oxide layer underlying the apertures in the nitride layer to form apertures In the oxide layer; and growing epitaxial silicon in the apertures to form silicon pillars.

18. The method of claim 17, wherein the second polymer type is polystyrene.

19. The method of claim 18, wherein the first polymer type is polybutadiene.

20. The method of claim 17, wherein the voids are generally spherical in shape and have diameters between 30 and 70 nm.

* * * * *